United States Patent [19]

Kato et al.

[11] Patent Number: 4,695,862

[45] Date of Patent: Sep. 22, 1987

[54] SEMICONDUCTOR APPARATUS

[75] Inventors: Yoji Kato, Kanagawa; Seiichi Watanabe, Tokyo; Masaru Wada, Kanagawa, all of Japan

[73] Assignee: Sony Corporation, Tokyo, Japan

[21] Appl. No.: 778,537

[22] Filed: Sep. 20, 1985

[30] Foreign Application Priority Data

Sep. 20, 1984 [JP] Japan ................................ 59-197304

[51] Int. Cl.[4] ........................ H01L 29/72; H01L 29/80
[52] U.S. Cl. .......................................... 357/36; 357/22; 357/34
[58] Field of Search ........................ 357/34, 35, 36, 58, 357/22 R, 22 F, 22 G

[56] References Cited

U.S. PATENT DOCUMENTS

| 3,038,087 | 6/1962 | Lüscher | 357/36 X |
|---|---|---|---|
| 3,103,599 | 9/1963 | Henkels | 357/34 X |
| 3,221,215 | 11/1965 | Osafune et al. | 357/34 X |
| 3,372,069 | 3/1968 | Bailey et al. | 357/58 X |
| 3,493,824 | 2/1970 | Richman et al. | 357/58 X |
| 3,518,505 | 6/1970 | Jantsch | 357/34 |
| 3,582,726 | 6/1971 | Gilbert | 357/36 |
| 3,703,420 | 11/1972 | Vora | 357/35 X |
| 3,840,886 | 10/1974 | Ashar et al. | 357/22 F |
| 3,855,609 | 12/1974 | Magdo et al. | 357/22 F |
| 3,936,856 | 2/1976 | Magdo | 357/22 F |
| 3,958,264 | 5/1976 | Magdo | 357/34 |
| 4,339,765 | 7/1982 | Nakamura et al. | 357/35 X |

FOREIGN PATENT DOCUMENTS 56-30750   3/1981   Japan ..................................... 357/34

Primary Examiner—Martin H. Edlow
Assistant Examiner—Sara W. Crane
Attorney, Agent, or Firm—Hill, Van Santen, Steadman & Simpson

[57] ABSTRACT

A semiconductor apparatus which includes a semiconductor substrate with semi-insulating properties and with a first region of a first conductivity type which will become the emitter region and a second region of the same first conductivity type which will become a collector region with the first and second regions formed in the semi-insulating semiconductor substrate and spaced apart from each other and a third region of a second conductivity type formed in the semi-insulating conductor substrate between the first and second regions and with forward biasing voltage applied between the third and first regions so as to form an imaginary base region in the semi-insulating semiconductor substrate beneath the third region due to implanted majority carriers from the third region so that the semiconductor apparatus operates as a bipolar transistor and wherein at least the first and/or the third regions consist of a plurality of regions.

6 Claims, 6 Drawing Figures

SEMICONDUCTOR APPARATUS

BACKGROUND OF THE INVENTION

1. Field of the Invention

This invention relates in general to a semiconductor apparatus designed to operate as a bipolar transistor and particularly to a semiconductor apparatus suitable for high output and high frequency.

2. Description of the Prior Art

The prior art bipolar transistor used as a circuit element of a semiconductor integrated circuit is formed in a socalled lateral structure and has an emitter region, a base region and a collector region which are respectively located for easy manufacture and simplicity of wiring. However, the prior art bipolar transistor using such lateral structure generally has a small current amplifiction factor $\beta$ which is a disadvantage.

The assignee of the present invention has previously proposed a novel semiconductor apparatus which is formed in a lateral structure and which can carry out bipolar transistor operation with a large current amplification factor $\beta$ which is disclosed in published Japenese patent application which has been unexamined and is identified as number 224841/1983. FIGS. 1 and 2 of the present application illustrate an example of such semiconductor aparatus.

FIGS. 1 and 2 disclose the previously proposed semiconductor apparatus which is formed such that on one major surface 1a of a semiconductor substrate 1 having semi-insulating property there is formed a first region 2 of, for example n+ conductivity type which will become an emitter region. A second region 3 of n+ conductivity type which will become a collector region is formed in the substrate 1 and is spaced apart from the region 2. A third region 4 of p+ conductivity type is formed betwen the regions 2 and 3 as illustrated. Emitter electrode 5 is formed on the emitter 2, a collector electrode 6 is formed on the collector region 3 and a base electrode 7 is formed on the region 4. With the arrangement illustrated in FIGS. 1 and 2, when a forward biasing voltage is applied between the first and third regions 2 and 4, holes will be injected with high concentration from the third region 4 into the region of the semi-insulation semiconductor substrate beneath the third region 4 so as to form an imaginary base region 8 in such region as indicated in dashed line FIG. 1 and electrons injected from the first region 2 are introduced through the imaginary base region 8 to the second region 3 which is biased in the positive directions so that the semiconductor apparatus will operate as a bipolar transistor of the n-p-n type.

SUMMARY OF THE INVENTION

It is an object of the present invention to provide a semiconductor apparatus of a lateral structure which can operate as a bipolar transistor with high current amplification factor.

It is another object of the invention to provide a semiconductor apparatus which is formed as a compound semiconductor and can operate at high speed.

It is a further object of the invention to provide a semiconductor apparatus which has a characteristic which is uniform and which can be easily manufactured.

It is yet a further object of the invention to provide a semiconductor apparatus in which the wiring pattern can be simplified and which is suitable for use as a circuit element of an integrated circuit.

A still a further object of the invention is to provide a semiconductor apparatus which can be used for high output and high frequencies.

According to one aspect of the invention, a semiconductor apparatus is provided which has a semiconductor substrate with semi-insulating properties in which is formed a first region of a first conductivity type and which becomes the emitter region and a second region of the first conductivity type which will become the collector region and the first and second regions formed in the semiconductor substrate and spaced a predetermined distance apart and a third region of a second conductivity type formed in the semi-insulating semiconductor substrate between the first and second regions and means for applying a forward biasing voltage between the third and first regions so as to form an imaginary base region in the semi-insulating semiconductor substrate beneath the third region using majority carrier implantation form said third region and wherein the semiconductor apparatus operates as a bipolar transistor and wherein at least the first and/or the third regions each consist of a plurality of regions.

Other objects, features and advantages of the present invention will become apparent from the following detailed description of illustrative embodiments thereof which are to be read in conjuction with the accompanying drawings throughout which like references designate the same elements and parts.

DESCRIPTION OF THE PREFERRED EMBODIMENTS

Figure 1:
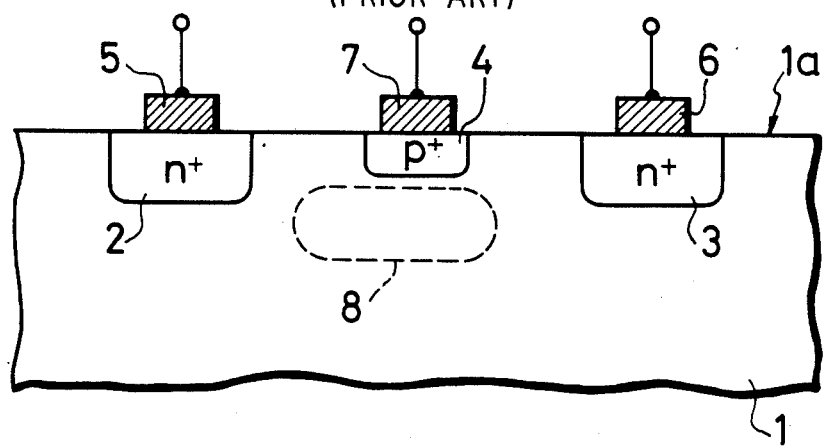
FIG. 1 is a schematic enlarged cross-sectional view of a prior art semicondutor apparatus.
Figure 2:
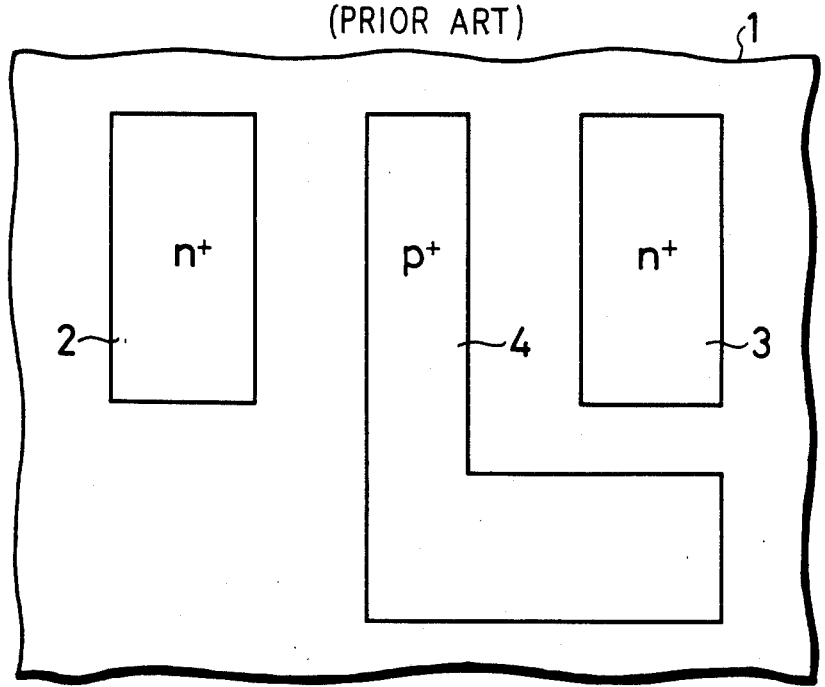
FIG. 2 is a plan view of the semiconductor apparatus of FIG. 1.
Figure 3:
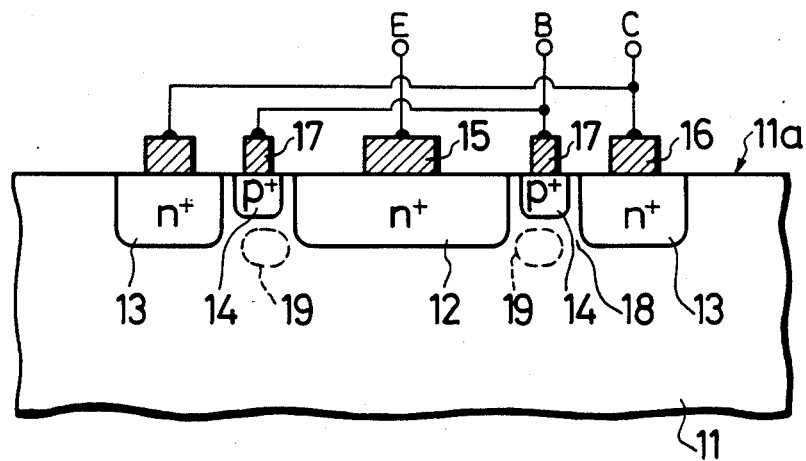
FIG. 3 is a schematic enlarged cross-sectional view illustrating an embodiment of a semiconductor apparatus according to the present invention.
Figure 4:
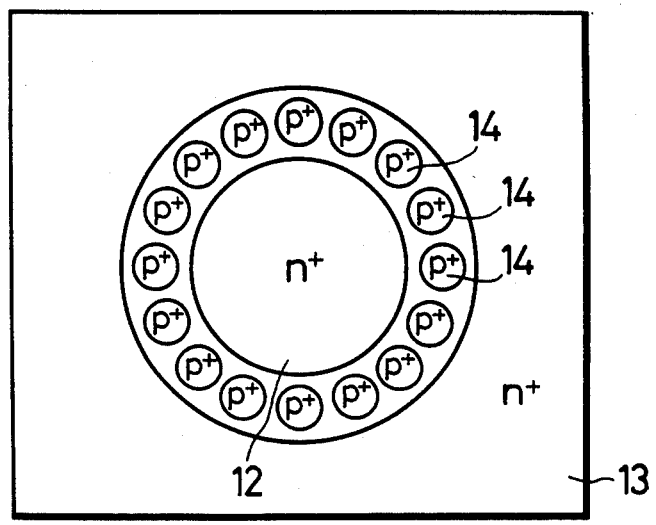
FIG. 4 is a schematic plan view of the apparatus of FIG. 3.

An embodiment of a semiconductor apparatus according to the invention will be described with reference to FIGS. 3 and 4. FIG. 3 is an enlarged cross-sectional view of the semiconductor apparatus and FIG. 4 is a plan view. According to the embodiment of the present invention, there is provided a III-V compound semiconductor substrate such as GaAs substrate or semiconductor layer 11 which has semi-insulating properties and which is substantially low in current carrier concentration and which has a high resistance as, for example, $10^6$ ohm cm. On one major surface 11a of the semiconductor layer 11 there is formed a first region 12 having a first conductivity type as, for example, n-type and having a high impurity concentration and the region 12 will become an emitter region. A second region 13 of the first conductivity type as, for example, n-type having high impurity concentration is formed in the substrate 11 in the surface 11a and the region 13 will become a collector region. The collector region is spaced apart from the emitter region 12. The region 13 is formed so as to surround the first region 12 and is formed for example by ion implantation methods or a diffusing method. In the illustrated example, the region 12 is formed in a circular disc-shape as illustrated in FIG. 4. Between the first and second regions 12 and 13, a plurality of third regions 14 of, for example a second conductivity type as, for example, p-type having a high impurity concentration are formed so as to surround the first region 12. The regions 14 are formed by ion implantation or by diffusion and are formed in a manner such that the third region 14 is formed so as to to between the regions 12 and 13. The third region 14 is formed so as to have a depth which is less than the depth of the regions 12 and 13 as illustrated in FIG. 3. On the first, second and third regions 12, 13 and 14 are formed an emitter electrode 15, a collector electrode 16 and a base electrode 17 in ohmic contact therewith, respectively. The base electrode 17 is formed so as to be common to all of the third regions 14 or, alternatively, there can be a separate base electrode associated with each of the regions 14 if desired. The letter E illustrates the emitter terminal, the letter C, the collector terminal and the letter B, the base terminal which are, respectively, connected to the elecctrodes 15, 16 and 17.

Forward biasing voltage is applied between the first and third regions 12 and 14 and reverse biasing voltage is applied between the third and second regions 14 and 13. Thus, holes serving as the majority carriers from the third regions 14 are implanted into the high resistance region 18 which is formed in the semi-insulating semiconductor substrate 11 beneath the third region 14 to thereby form an imaginary base region 19 illustrated in dashed line. Due to the imaginary base region 19, the implantation of electrons as the majority carriers from the first region 12 is promoted and the implanted electrons reach through the imaginary base region 19 to the second region 13 and, thus, the semiconductor apparatus of the invention will operate as an n-p-n bipolar transistor having lateral structure.

Figure 5:
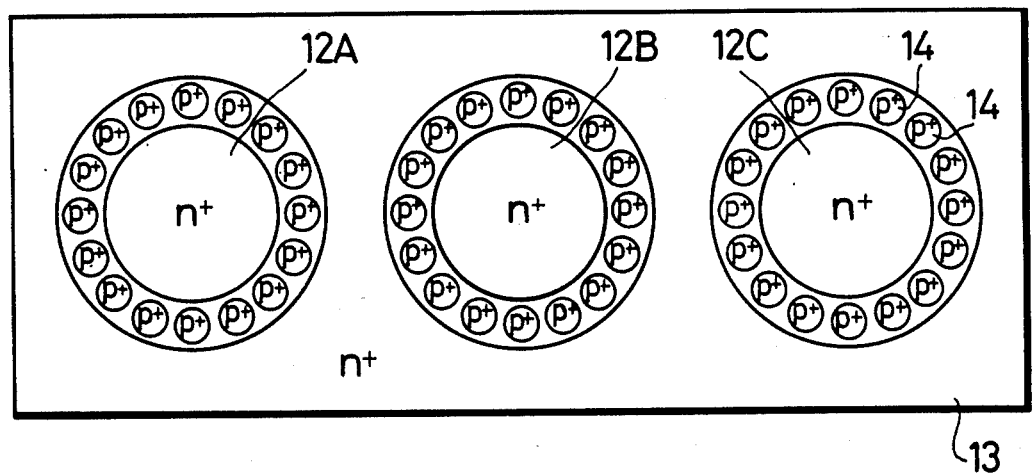
FIG. 5 is a plan view of a modification of the invention.

FIG. 5 is a plan view illustrating another embodiment of the semiconductor apparatus according to the present invention. As shown in FIG. 5 there are provided a plurality of first regions 12A, 12B, and 12C spaced from each other in the surface of the semiconductor substrate. The first regions 12A, 12B and 12C will become emitter regions. A second region 13 which will become a common collector region surrounds the first regions 12A, 12B and 12C. Between each of the first regions 12A, 12B and 12C, there are respectively formed a plurality of third regions 14 so as to surround each of the first regions 12A, 12B and 12C as illustrated. It is to be realized, of course, that emitter base and collector electrodes are, respectively, connected to the regions 12A, 12B, 12C, the collector region 13 and the regions 14.

Figure 6:
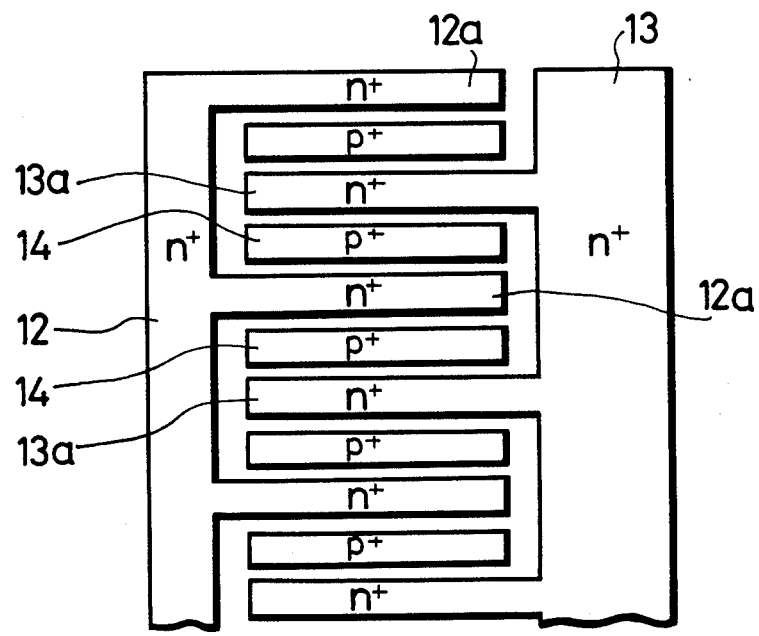
FIG. 6 is a plan view of another modification of the invention.

FIG. 6 illustrated an additional embodiment of a semiconductor apparatus according to the invention. In FIG. 6 a first region 12 is formed in a comb-teeth shape so as to have a plurality of parallel extending members 12a which will serve as emitter regions. A second region 13 of comb-teeth shape is formed by connected ends of a plurality of parallel region members 13a which will serve as collector regions and are respectively mounted between the parallel members 12a as shown. The members 12a and 13a are alternately spaced between each other. Between each of the members 12a and 13a are formed parallel extending third regions 14 of opposite conductivity type to the regions 12a and 13a and in FIG. 6, for example, the regions 12a and 13a are indicated as n+ conductivity and the regions 14 are indicated as p+ conductivity type. It is to be realized, of course, that suitable electrodes are respectively connected to the emitters 12a, the collectors 13a and the base regions 14.

According to the semiconductor apparatus of the present invention described above which are of the lateral structure has an advantage in that the current amplification factor $\beta$ can be large. That is, since substantially the base region or the current path formed by the implanted carriers are formed in the semi-insulating region 18 outside of the third region 14 having the high impurity concentration, the diffusion length of the implanted carriers is extremely long and the implanted carriers are not affected by the portion of the semiconductor surface where recombination rate is high and, thus, the implanted carriers do not flow through the third region 14 but flow through a portion of the semi-insulating region 18 where the potential barrier is low and flat and which portion is not substantially affected by the collector voltage and so forth. Thus, the semiconductor apparatus of the present invention can operate as a bipolar transistor function having a large current amplification factor.

Also, when the semiconductor apparatus of the invention is formed by using a compound semiconductor, it is possible to obtain a semiconductor apparatus capable of operating at high speeds.

Since the substantially base region is formed in the semi-insulating semiconductor, the charateristics of the semiconductor apparatus are very little affected by the depth of the third region or scattering characteristic or similar effects. Thus, it is possible to easily manufacture a semiconductor apparatus which has a stable and uniform characteristic.

Also, this semiconductor apparatus of the invention is in the form of a lateral structure, it is easy to provide lead out electrodes and to connect wiring to the electrodes. Thus, the semiconductor apparatus is advantageous for forming integrated circuits.

Furthermore, since the semiconductor apparatus of the invention is formed on semi-insulating semiconductor, when the semi-conductor apparatus of the invention is applied to the integrated circuit, there is the advantage that isolation between the circuit elements can be simplified.

In the semiconductor apparatus of the invention, particularly illustrated in FIGS. 4, 5 and 6, the plurality of third regions 14 are provided so as to surround the first region 12 or, alternatively, a plurality of first regions 12 are provided and a plurality of third regions are provided so as to surround each of the first regions 12 or, alternatively, the first regions 12, the second regions 13 and the third region 14 are provided as plural elements. Accordingly, even if the semiconductor apparatus of the invention is operated with high current output, it will not be destroyed so that it is possible to obtain a semiconductor apparatus which is suitable for high current and power output and high frequency operation. In addition, the semiconductor apparatus of the invention is very suitable not only where it is used alone, but also where it is used as a circuit element of an integrated circuit at a position, for example, where the fan-in or fan-out is large.

Although the above description is given for preferred embodiments of the invention, it will be apparent that many modifications and variations could be effected by one skilled in the art without departing from the spirit or scope of the novel concepts of the invention as defined by the appended claims.

We claim as our invention:

1. A semiconductor apparatus comprising, a semi-insulating semiconductor substrate, a disc-shaped emitter region of a first conductivity type formed in said semiconductor substrate, a collector region of a first conductivity type formed in said semiconductor substrate and spaced from said emitter region, and formed with a round central opening in which said disc-shaped emitter region is symmetrically mounted, a plurality of third regions of a second conductivity type formed in said semiconductor substrate in said central opening between said collector and said disc-shaped emitter regions and arranged in a circular shape, first voltage biasing means for forward biasing said emitter region relative to said plurality of third regions, and second voltage biasing means for reverse biasing said collector region relative to said plurality of third regions, to form imaginary base regions in said semi-insulating substrate beneath said plurality of third regions by majority carrier implantation from said plurality of third regions so that said semiconductor apparatus operates as a bipolar transistor.

2. A semiconductor apparatus comprising, a semi-insulating semiconductor substrate, a disc-shaped emitter region of a first conductivity type formed in said semiconductor substrate, a collector region of a first conductivity type formed in said semiconductor substrate and spaced from said emitter region, and formed with a round central opening in which said disc-shaped emitter region is symmetrically mounted, a plurality of third regions of a second conductivity type formed in said semiconductor substrate in said central opening between said collector and said disc-shaped emitter regions and arranged in a circular shape, first voltage biasing means for forward biasing said emitter region relative to said plurality of third regions, and second voltage biasing means for reverse biasing said collector region relative to said plurality of third regions so that said semiconductor apparatus operates as a bipolar transistor, and wherein said plurality of third regions comprise a plurality of disc-shaped regions arranged in an annular form about said disc-shaped emitter region in said central opening of said collector region.

3. A semiconductor apparatus according to claim 2 wherein said plurality of third regions extend down into said substrate a shorter distance than said collector region or said emitter region.

4. A semiconductor apparatus comprising, a semi-insulating semiconductor substrate, a plurality of disc-shaped emitter regions of a first conductivity type formed in said semiconductor substrate and laterally spaced from each other, a collector region of a first conductivity type formed in said semiconductor substrate and formed with a plurality of round central openings in which said plurality of emitter regions are located, a plurality of third regions of a second conductivity type formed in said semiconductor substrate and a number of said plurality of third regions located in each of said plurality of central openings of said collector regions about each of said emitter regions, first voltage biasing means for forward biasing said plurality of emitter regions relative to said plurality of third regions, and second voltage biasing means for reverse biasing said plurality of collector regions relative to said plurality of third regions, to form imaginary base regions in said semi-insulating substrate beneath said plurality of third regions by majority carrier implantation from said plurality of third regions so that said semiconductor apparatus operates as a bipolar transistor, and wherein said number of said plurality of third regions are formed in an annular shape in said central openings.

5. A semiconductor apparatus comprising, a semi-insulating semiconductor substrate, a plurality of disc-shaped emitter regions of a first conductivity type formed in said semiconductor substrate and laterally spaced from each other, a collector region of a first conductivity type formed in said semiconductor substrate and formed with a plurality of round central openings in which said plurality of emitter regions are located, a plurality of third regions of a second conductivity type formed in said semiconductor substrate and a number of said plurality of third regions located in each of said plurality of central openings of said collector regions about each of said emitter regions, first voltage biasing means for forward biasing said plurality of emitter regions relative to said plurality of third regions, and second voltage biasing means for reverse biasing said plurality of collector regions relative to said plurality of third regions so that said semiconductor apparatus operates as a bipolar transistor, and wherein said number of said plurality of third regions are formed in an annular shape in said central opening, and wherein said plurality of third regions are disc-shaped.

6. A semiconductor apparatus according to claim 5 wherein said plurality of third regions extend down into said substrate a shorter distance than said collector regions or said emitter regions.

* * * * *